United States Patent
Stanley et al.

(10) Patent No.: US 9,110,142 B2
(45) Date of Patent: Aug. 18, 2015

(54) METHODS AND APPARATUS FOR TESTING MULTIPLE-IC DEVICES

(75) Inventors: Michael E. Stanley, Mesa, AZ (US); Joseph S. Vaccaro, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 874 days.

(21) Appl. No.: 13/250,368

(22) Filed: Sep. 30, 2011

(65) Prior Publication Data

US 2013/0085704 A1    Apr. 4, 2013

(51) Int. Cl.
  *G01R 31/3185*    (2006.01)
(52) U.S. Cl.
  CPC  *G01R 31/318555* (2013.01); *G01R 31/318572* (2013.01); *G01R 31/318513* (2013.01); *H01L 2924/0002* (2013.01)
(58) Field of Classification Search
  CPC ............... G01R 31/318513; G01R 31/318555; G01R 31/318572
  USPC ........................................................ 714/727
  See application file for complete search history.

(56) References Cited

U.S. PATENT DOCUMENTS

| | | | |
|---|---|---|---|
| 5,056,093 A * | 10/1991 | Whetsel | 714/729 |
| 6,115,836 A * | 9/2000 | Churchill et al. | 714/726 |
| 6,125,464 A | 9/2000 | Jin | |
| 6,324,662 B1 | 11/2001 | Haroun et al. | |
| 7,089,463 B1 * | 8/2006 | Baeg et al. | 714/712 |
| 7,590,910 B2 | 9/2009 | Haroun et al. | |
| 7,818,640 B1 | 10/2010 | Lerner | |
| 2001/0021558 A1 * | 9/2001 | Sato et al. | 438/286 |
| 2005/0166106 A1 * | 7/2005 | Warren | 714/724 |
| 2006/0020864 A1 * | 1/2006 | Turner et al. | 714/726 |
| 2006/0212760 A1 * | 9/2006 | Swoboda | 714/38 |
| 2009/0019328 A1 | 1/2009 | Van De Logt | |
| 2009/0134904 A1 * | 5/2009 | Zjajo et al. | 324/765 |
| 2009/0222251 A1 * | 9/2009 | Gloekler et al. | 703/14 |
| 2009/0309609 A1 | 12/2009 | De Jong et al. | |
| 2010/0109678 A1 | 5/2010 | Wong | |

OTHER PUBLICATIONS

Corelis, "JTAG Tutorial," Oct. 1, 2010 [retrieved on Feb. 23, 2015]. Retrieved from the Internet< URL: https://web.archive.org/web/20101001084426/http://www.corelis.com/education/JTAG_Tutorial.htm>.*

IEEE-SA Standards Board, "IEEE Standard Test Access Port and Boundary-Scan Architecture," Test Technology Standards Committee of the IEEE Computer Society, Mar. 27, 2008.

* cited by examiner

*Primary Examiner* — Sujoy Kundu
*Assistant Examiner* — Liam R Casey
(74) *Attorney, Agent, or Firm* — Sherry W. Schumm (57) ABSTRACT

Embodiments include systems that include at least one integrated circuit (IC) and methods for their testing. Each IC includes an input interconnect to receive an input signal, a test enable interconnect to receive a test enable signal, and a controller (e.g., a TAP controller) for performing testing of the integrated circuit based on values in at least one register (values corresponding to the input signal). Each IC also includes an input port and a multiplexer coupled to the first input interconnect, the at least one register, and the input port. The multiplexer is controllable to pass the input signal to the input port in response to non-assertion of the test enable signal, and to pass the input signal to the at least one register in response to assertion of the test enable signal. When the system includes multiple controllers, each controller may implement a different opcode-to-instruction mapping.

14 Claims, 5 Drawing Sheets

METHODS AND APPARATUS FOR TESTING MULTIPLE-IC DEVICES

TECHNICAL FIELD

Embodiments relate to testing methods and apparatus for integrated circuits.

BACKGROUND

To facilitate debug operations, many current integrated circuits (ICs) include Joint Test Action Group (JTAG) compliant circuitry (standardized as IEEE 1149.1 Standard Test Access Port and Boundary-Scan Architecture). JTAG-compliant circuitry and methods of using the circuitry in testing an IC (collectively referred to simply as "JTAG") provides access to internal blocks of an IC, making JTAG particularly well suited for debugging embedded systems. More particularly, in a device that supports JTAG-compliant boundary scan technology, signals between the device's core logic and the device's pins are intercepted by boundary scan cells, which are coupled together to form a serial scan path known as the boundary scan register (BSR). Normally, the boundary scan cells do not affect IC operations. In test mode, however, the boundary scan cells may be used to set and/or read values. For example, JTAG may be used to manipulate the external interface to an IC's BSR in order to test for certain types of faults (e.g., shorts, opens, and logic faults).

When implemented on an IC, JTAG-compliant circuitry includes, at least, a JTAG interface and a controller with access to an instruction register and a plurality of data registers. The JTAG interface (collectively known as a test access port, or TAP) is either a four-interconnect or a five-interconnect interface. The four primary interconnects include: TMS (test mode state); TCK (clock); TDI (test data in); and TDO (test data out). The JTAG interface may include an extra interconnect when a TRST (test reset) interconnect is implemented. A test reset signal provided via a TRST interconnect may cause a corresponding test reset circuit to generate a system level reset, in an embodiment.

To communicate with a JTAG interface, a host computer may be connected to a target IC's JTAG interface (e.g., through a JTAG adaptor), and the host computer may cause signals to be provided to or read from the JTAG interface. More particularly, the host computer communicates with an IC's TAP controller by manipulating signals on TMS and TDI in conjunction with clocking signals on TCK, and by reading signals presented by the IC on TDO. The state of the TAP controller may change on TCK transitions.

In some multiple-IC systems, such as a system-in-package (SiP), there may be an insufficient number of available package pins to support dedicated, external JTAG interface pins for each IC of the system. Some of these systems may include a single set of external JTAG interface pins that connect, either directly or indirectly, with the JTAG interfaces of the various ICs. In order to test one of the ICs, all ICs except for the IC under tested are set into a "TDI-to-TDO bypass" mode (i.e., a mode in which the IC's TDI and TDO interconnects are essentially directly connected through a TDI-to-TDO bypass register of the IC). In such a configuration, the TDI signals presented at the external TDI pin are passed to the IC under test, and the TDO signals produced by the IC under test appear at the external TDO pin.

Figure 1:
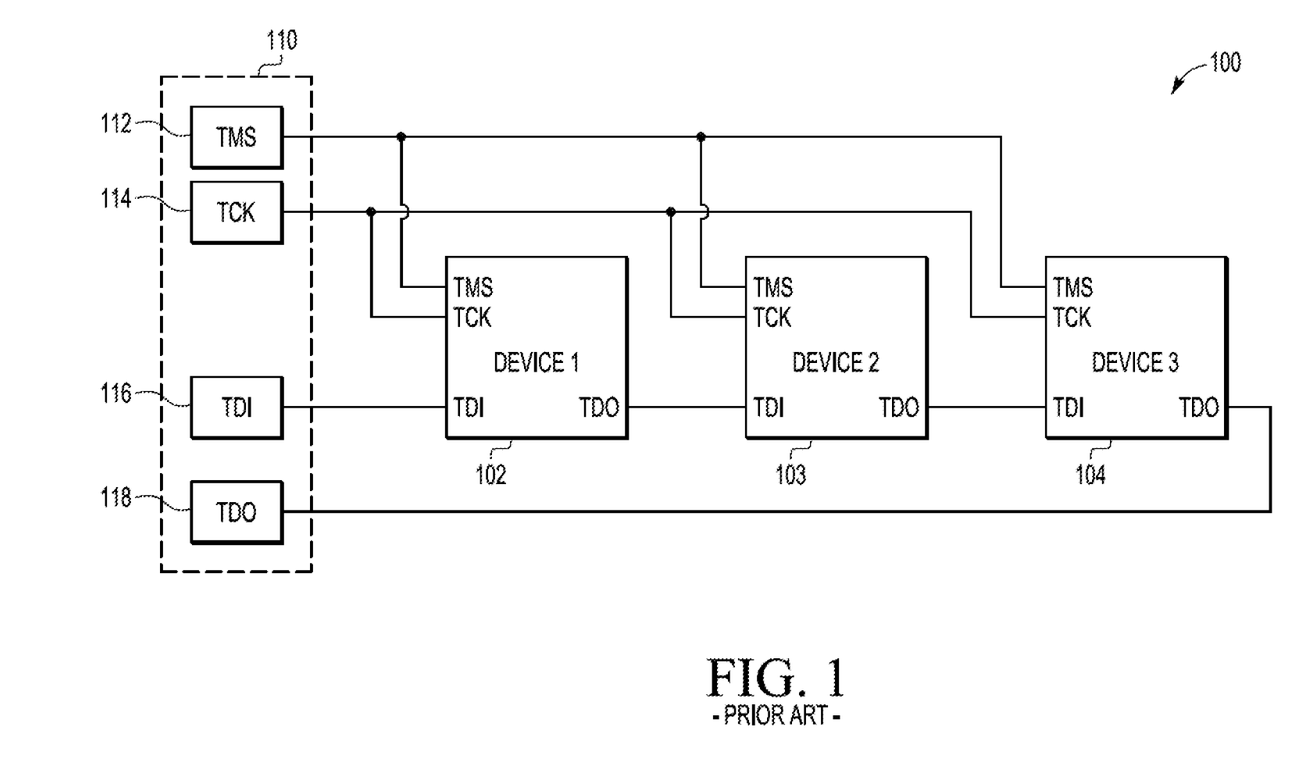
FIG. 1 illustrates a simplified circuit diagram of a plurality of interconnected ICs with JTAG testing capability, in accordance with the prior art.

For example, FIG. 1 illustrates a simplified circuit diagram 100 of a plurality of ICs 102, 103, 104 with their JTAG TDO and TDI interconnects daisy-chained together, in accordance with the prior art. In the illustrated configuration, access to all of the ICs 102-104 may be provided through a single, external JTAG interface 110. The TMS pin 112 and TCK pin 114 are directly connected to the TMS and TCK interconnects of each IC 102-104, and the TDI and TDO interconnects are daisy-chained together. In other words, the TDI interconnect of a first IC 102 is directly connected to the external TDI pin 116, the TDO interconnect of the first IC 102 is connected to the TDI interconnect of the second IC 103, the TDO interconnect of the second IC 103 is connected to the TDI interconnect of the third IC 104, and the TDO interconnect of the third IC 104 is directly connected to the external TDO pin 118.

To test any one of the ICs (e.g., IC 104), the other ICs (e.g., ICs 102, 103) are set into TDI-to-TDO bypass mode (e.g., by clocking in a BYPASS instruction). The clock input is provided at the TCK pin 114, and clocking changes on the TMS pin 112 step through a standardized JTAG state machine implemented in each of the ICs TAP controllers (not illustrated). In the Shift_IR and Shift_DR states, one bit of data may be transferred from the TDI pin 116 into and out of each tap controller instruction or data register (also not illustrated), respectively, in conjunction with each TCK clock pulse. For example, typical instructions might include: reading or writing data to a data register (e.g., the BSR, TDI-to-TDO bypass register, or the IDCODE register); sampling input pins; driving (or floating) output pins; and so on. Although all of the ICs 102-104 operate in lockstep, only the IC under test (i.e., the IC that is not in TDI-to-TDO bypass mode) is affected by the input signal on the external TDI pin 116 in order to produce valid test data on its TDO port. That valid test data, in turn, is produced at the external TDO pin 118.

DETAILED DESCRIPTION

Although prior, multiple IC SiPs that are JTAG compliant (e.g., circuit 100, FIG. 1) provide some limited ability to test each of the multiple ICs in the SiP, testing configurations are desired that may reduce required numbers of package pins and inter-IC routing within a package. Embodiments include systems (e.g., a SiP) in which complementary test circuitry on multiple ICs (e.g., multiple controllers) allow internal ICs with no direct JTAG connection to external circuitry (e.g., no external JTAG pins) to be fully testable. In addition, embodiments include configurations in which JTAG interconnects are multiplexed with input slave ports and output master ports in order to reduce external package pins and inter-IC routing. Embodiments of the inventive subject matter may be used with any of a variety of multiple-IC systems, including SiPs, systems on a chip (SoCs), and systems that include separately packaged ICs interconnected through a circuit board. Although a specific example of a SiP is described herein, it is to be understood that the example is not meant to be limiting, and that the example is provided to enhance understanding of the various embodiments.

As used herein, the term "pin" means a conductive connection between circuitry external to a package and circuitry internal to the package. A "pin" should be interpreted to include a pin, a pad, a bump, a ball, and any other conductive connection. The term "interconnect" means an input (I) conductor for a particular IC, an output (O) conductor for a particular IC, or a conductor serving a dual I/O purpose for a particular IC. In some cases, an interconnect may be directly coupled with a package pin, and in other cases, an interconnect may be coupled with an interconnect of another IC, as is described in more detail herein.

Figure 2:
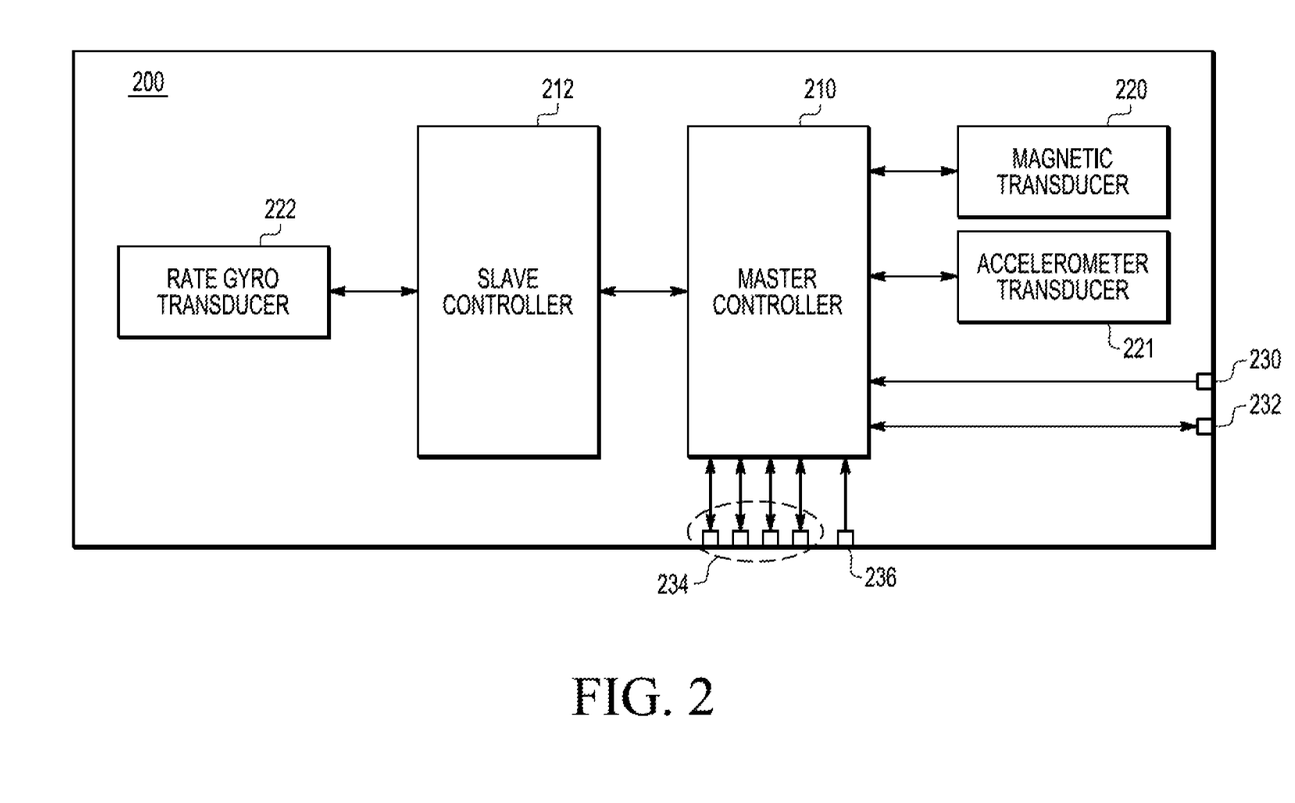
FIG. 2 illustrates a simplified block diagram of an example system in which an embodiment of the inventive subject matter may be implemented.

FIG. 2 illustrates a simplified block diagram of an example system 200 in which an embodiment of the inventive subject matter may be implemented. More particularly, system 200 is a SiP that may be incorporated into a device to sense the motion (e.g., displacement and rotation) of the device in three-dimensional space (providing measurement of six degrees of freedom), and also to track the location of the device on the Earth.

System 200 includes multiple controller ICs 210, 212 (referred to herein as "controllers") and multiple transducers 220, 221, 222. More particularly, a master controller 210 is used to interface with a magnetic transducer 220 and an accelerometer transducer 221, and a slave controller 212 is used to interface with a rate gyro transducer 222. The magnetic transducer 220 is configured to produce signals indicating the strength of the Earth's magnetic field, which information may be used for navigation-related and location-related applications. The accelerometer transducer 221 and the rate gyro transducer 222 produce signals (e.g., indicating acceleration and rate of change of angle), which enable the linear motion and orientation of the device to be determined. This information may be useful for a variety of purposes, including determining which orientation (e.g., portrait or landscape) to use to display information on a display device, among other things.

Both the master controller 210 and the slave controller 212 may be configured in a functional mode, a JTAG test mode, or another type of test mode. As indicated above, when configured in a functional mode, the master controller 210 is used to interface with a magnetic transducer 220 and an accelerometer transducer 221, and the slave controller 212 is used to interface with a rate gyro transducer 222. When configured in the JTAG test mode, the master controller 210 and the slave controller 212 are designed to support JTAG-compliant testing.

As shown, the master controller 210, which is upstream of the slave controller 212, is directly connected to various ones of the system's I/O pins, while the slave controller 212 is not directly connected to system I/O pins. In the illustrated embodiment, the master controller 210 is shown to be connected with pins 230, 232, 234, and 236. Pin 230 represents one or more analog inputs to master controller 210, which may originate from one or more remote analog sensors, for example. Pin 232 represents a serial port, which may be connected to one or more other external devices (e.g., other sensors, not illustrated). The serial port may correspond to a master/slave serial port, for example, to support master controller 210 mastering other external devices. In an embodiment in which the serial port is an I2C (inter-integrated circuit) port, for example, pin 232 actually may include two or more pins. Alternatively, in an embodiment in which the serial port is a SPI (serial peripheral interface), pin 232 actually may include four or more pins. Some devices may have an option to implement a SPI or an I2C port (e.g., the port may be a dual-mode I2C/SPI port). Other serial or parallel port protocols also may be implemented, in other embodiments.

In an embodiment, the master controller 210 also is connected with a plurality of "dual-purpose" pins 234 that may be used in both the functional and JTAG test modes. More particularly, when the master controller 210 is configured in a functional mode, the pins 234 correspond to an external slave port (e.g., a SPI, I2C or other interface), which may provide interconnectivity with an external processor (e.g., an external application processor). When the master controller 210 is configured in a JTAG test mode, the pins 234 correspond to an external JTAG port. As will be described in more detail later, the master controller's slave port and tap controller (neither illustrated) are multiplexed to enable the dual-purpose functionality of pins 234. Both the master controller 210 and the slave controller 212 include "dual-purpose" interconnects, as well. The dual-purpose interconnects of master controller 210 are coupled with the dual purpose pins 234, and the dual-purpose interconnects of slave controller 210 are coupled with corresponding bypass interconnects of the master controller 210, as will be explained in more detail later. Essentially, the dual-purpose interconnects of the master and slave controllers 210, 212 correspond to slave ports or JTAG ports, depending on whether the controllers are in the functional or JTAG test modes.

According to an embodiment, the master controller 210 also is connected with an external test enable (TE) pin 236, which is used to configure the master controller 210 and the slave controller 212 in either the functional mode or the JTAG test mode. In an embodiment, when no signal is asserted on the TE pin 236, the master controller 210 and slave controller 212 are in the functional mode, and the dual-purpose pins 234 correspond to an external slave port (e.g., a SPI or I2C interface). Conversely, when a signal is asserted on the TE pin 236 and that signal is conveyed from the master controller 210 to the slave controller 212, both the master controller 210 and slave controller 212 are in the JTAG test mode, and the dual-purpose pins 234 correspond to an external JTAG port. More specifically, in the JTAG test mode, pins 234 correspond to TDI (test data in), TMS (test mode state), TCK (clock), and TDO (test data out) pins. The JTAG pins also may include a TRST (test reset) pin (not illustrated).

Once in the JTAG test mode, either the master controller 210 or the slave controller 212 may be configured in a "TDI-to-TDO bypass mode" by clocking a BYPASS instruction into TAP controller instruction registers (not illustrated) of the master or slave controller 210, 212. In the TDI-to-TDO bypass mode, data clocked in on the TDI interconnect passes through a TDI-to-TDO bypass register to the TDO interconnect. In order to perform JTAG testing on the master controller 210, the slave controller 212 may be configured in the TDI-to-TDO bypass mode, at various times, although configuration in the TDI-to-TDO bypass mode is not required for all JTAG testing. Similarly, to perform JTAG testing on the slave controller 212, the master controller 210 may be configured in the TDI-to-TDO bypass mode, at various times. When the master controller 210 is in the TDI-to-TDO bypass mode, the master controller 210 passes signals present on the external TDI, TMS, TCK, and TE pins 234, 236 through to corresponding JTAG interconnects of the slave controller 212, and passes signals present on the slave controller's TDO interconnect through to the external TDO pin 234.

Although not shown, system 200 also may include additional peripherals, memory, and so on. In addition, it is to be understood that system 200 represents just one example of a system in which embodiments of the inventive subject matter may be incorporated. In other embodiments, a system may include more than two controllers, ICs other than controllers, and/or each of the controllers or ICs may interface with different types of transducers, ports or other circuitry. A more general description of an IC with JTAG testing capabilities according to an embodiment will now be given.

Figure 3:
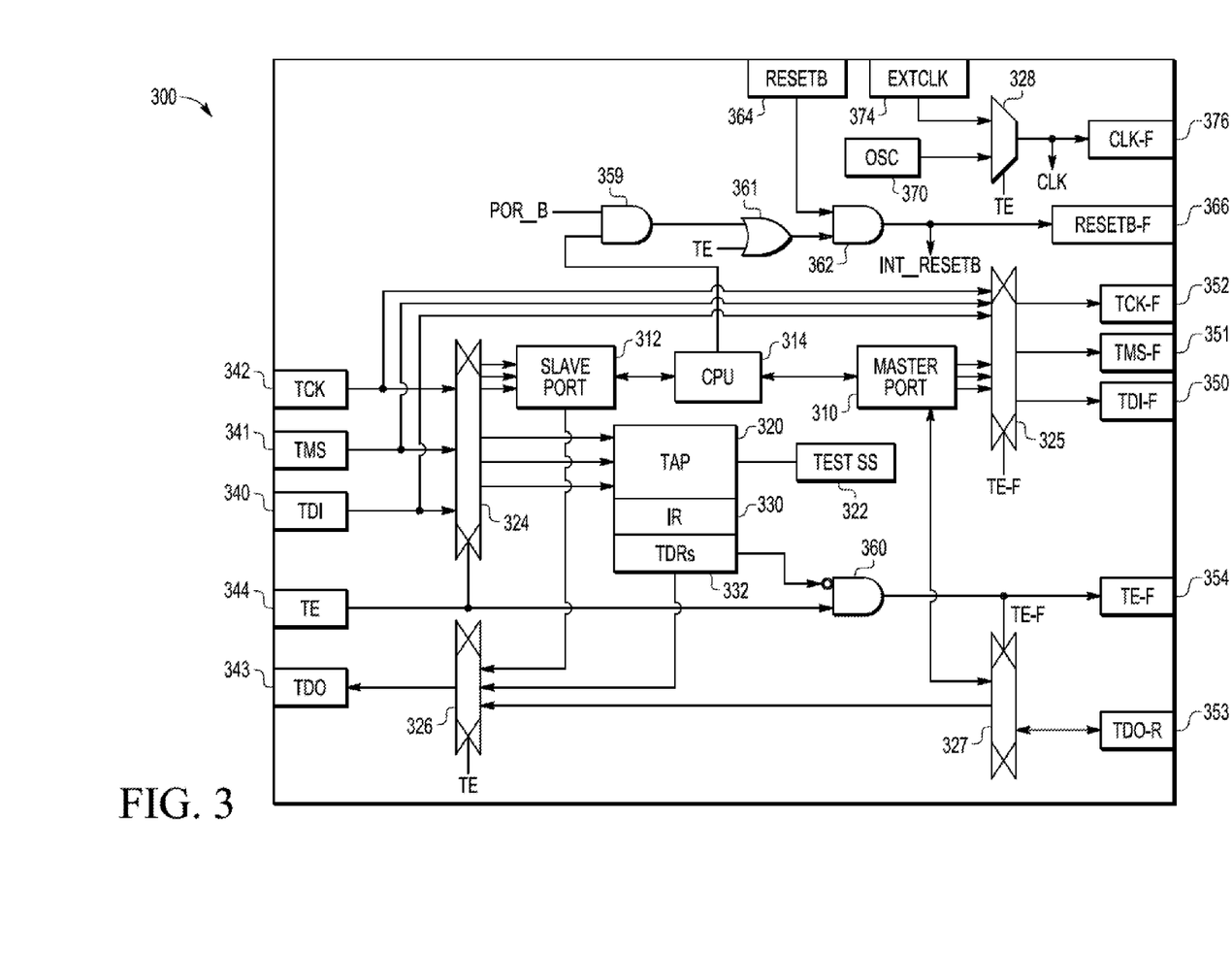
FIG. 3 illustrates a simplified block diagram of an IC with integrated test circuitry, according to an example embodiment.

More specifically, FIG. 3 illustrates a simplified block diagram of an IC (e.g., a controller or other IC) that includes an integrated test circuit 300, according to an example embodiment. In addition to the test circuit 300, the IC also includes a master port 310 (e.g., a SPI or I2C port), a slave port 312 (e.g., a SPI or I2C port), and a central processing unit (CPU) 314. In other embodiments, test circuitry such as that described herein may be used to test FPGAs (field programmable gate arrays), ASICs (application-specific integrated circuits), and other types of ICs. Although not illustrated, the IC also includes a plurality of signal (I/O) interconnects that interface with CPU 314, one or more power interconnects, and one or more ground interconnects. In addition, the IC may include other hardware having states that may be affected by operations performed using the test circuit 300, and one or more scan chains (not illustrated) that may be used to feed test patterns into CPU 314 or the other hardware.

Test circuit 300 is accessed through a JTAG port, which includes a plurality of JTAG interconnects. The JTAG interconnects include a TDI interconnect 340; a TMS interconnect 341; a TCK interconnect 342; and a TDO interconnect 343. The JTAG interconnects also may include a TRST (test reset) interconnect (not illustrated). As will be described in more detail below, the JTAG interconnects 340-343 are dual-purpose, in that they also may function as interconnects to the slave port 312 when the IC is configured in a functional mode. For convenience, however, FIG. 3 designates interconnects 340-343 (and corresponding interconnects 350-353, described later) with their JTAG designators.

The test circuit 300 of the IC includes a plurality of shift registers, a TAP controller 320, a test subsystem (SS) 322, multiplexers 324, 325, 326, 327, 328, and various other logic, the functionality of which will be described in detail below. The shift registers may include, for example, an instruction register (IR) 330 and a plurality of test data registers (TDR) 332.

The IR 330 receives signals from the TDI interconnect 340 via multiplexer 324 and TAP controller 320. The IR 330 is a shift register, which may hold a current instruction for execution by TAP controller 320. Essentially, the content of IR 330 is used by the TAP controller 320 to determine how to process signals received via the TDI interconnect 340. In many cases, the IR 330 includes an instruction that defines to which of the TDRs 332 input signals from the TDI interconnect 340 should be passed. The IR 330 may be, for example, between four to seven bits wide, although the IR 330 may be narrower or wider, in various embodiments.

The TDRs 332 are parallel connected between the TDI interconnect 340 (with multiplexer 324 and TAP controller 320 intervening) and the TDO interconnect 343 (with multiplexer 326 intervening) so that a selected TDR 332 will shift data one stage toward the TDO interconnect 343 after each rising edge of a clock signal on the TCK interconnect 342 when the TAP controller 320 is in the appropriate state (i.e., in the Shift_DR state). The size of the TDRs 332 may be fixed or variable. For example, the size of the TDRs 332 may be a function of the instruction (or value) currently in the IR 330, among other things.

The TDRs 332 may include a boundary scan shift register (BSR) (also referred to as a boundary scan chain or EXTEST register), a TDI-to-TDO bypass register, an optional identification register, and various other registers that affect the functionality of the IC, as will be described later. The BSR, which may or may not be implemented, in various embodiments, is comprised of a plurality of boundary scan cells connected in a dedicated path around the periphery of the IC, and the BSR is used to move data to and from the I/O pins of the IC. More particularly, a boundary scan cell may be connected between each signal interconnect (or pin) and internal logic. The contents of the BSR may be described using a BSDL (boundary scan description language) file. When the IC is in the TDI-to-TDO bypass mode, the TDI-to-TDO bypass register (e.g., a single bit register) is used to pass data from the TDI interconnect 340 to the TDO interconnect 343. The identification register (e.g., an IDCODE register of 32 bits) may be used to store an identification code for the IC. The identification code may have a format that includes a manufacturer code, a part number assigned by the manufacturer, and a part version code (or revision number), for example. The information in the IDCODE register may allow the IC to be linked to a corresponding BSDL file. Various control bits associated with JTAG testing may be designated in TDRs 332, as well. For example, one TDR control bit implemented in an embodiment is referred to herein as a "JTAG pass-through" control bit, which controls whether the IC is in a JTAG pass-through mode. When the IC is not in the JTAG pass-through mode (e.g., the JTAG pass-through control bit is set) the IC generates a TDO signal to be provided at the TDO interconnect of the IC. Conversely, when the IC is in the JTAG pass-through mode (e.g., the JTAG pass-through control bit is cleared), the IC receives a TDO signal from a downstream IC, and passes the TDO signal from the downstream IC through to the IC's TDO interconnect. In other words, the state of the JTAG pass-through bit can determine whether the most upstream IC or a downstream IC drives the external TDO interconnect 343.

Tap controller 320 has access to the IR 330 and the TDRs 332, and implements a JTAG state machine (e.g., as defined in IEEE Standard 1149.1), in which state transitions occur based on clocking changes on the TMS interconnect 341. For example, the JTAG state machine will have one state associated with shifting instructions into the IR 330 (e.g., in a Shift_IR state), and another state associated with shifting data through the TDRs 332 (e.g., in a Shift_DR state). Once an instruction is shifted into IR 330, TAP controller 320 may execute that instruction. As will be described in more detail later, various instruction opcodes are defined for TAP controller 320 includes instruction decode logic (not illustrated) that decodes opcodes shifted into the IR 330 according to a pre-defined mapping of opcodes to instructions. As will be described in more detail later, the decode logic of TAP controller 320 maps opcodes to instructions differently from the decode logic of other TAP controllers of the system. TAP controller 320 also may interface with test subsystem 322, which provides additional controls for various test modes (e.g., RAM BIST (built-in self test), scans (e.g., battery scans, internal scans), specialized analog test modes, and so on).

As discussed previously, the IC may be placed in a functional mode or a JTAG test mode. According to an embodiment, signals provided on a test enable (TE) interconnect 344 control whether the IC is in the functional or JTAG test mode, and also affect the operation of multiplexers 324-326. More particularly, when a signal is asserted on the TE interconnect 344, the IC is in the JTAG test mode, and each of the multiplexers 324-326 pass signals relating to JTAG testing, as will be described in more detail below. Conversely, when no signal is asserted on the TE interconnect 344, the IC is in the functional mode, and each of the multiplexers 324-326 pass signals relating to the functional mode. Those of skill in the art would understand that, in an alternate embodiment, the IC may be in the functional mode when a signal is asserted on the TE interconnect 344, and may be in the JTAG test mode when no signal is asserted on the TE interconnect 344. For convenience, however, the description, below, corresponds to an embodiment in which the IC is in a JTAG test mode when a signal is asserted on the TE interconnect 344. As will be described in more detail below, multiplexers 326, 327 are controllable to place the IC in a JTAG pass-through mode, at various times. In the JTAG pass-through mode, multiplexers 326, 327 are configured to pass a TDO signal received from a downstream IC (via the TDO-R (TDO reverse) interconnect 353) through toward the TDO interconnect 343 of the IC. Accordingly, multiplexers 326, 327 may be referred to herein as "TDO multiplexers." The operation of TDO multiplexer 326 is primarily controlled by signals provided on the TE interconnect 344, as described above, and the operation of TDO multiplexer 327 is controlled by the state of a test enable forward (TE-F) signal provided on the TE-F interconnect 354. As mentioned previously and described in more detail later, the state of the TE-F signal is affected by the JTAG pass-through control bit in the TDRs 332, in an embodiment.

Essentially, multiplexers 324-327 comprise circuitry that provides the dual-purpose functionality of interconnects 340-343, 350-353, and that facilitates transfer of JTAG and other signals through the IC. As mentioned above, the operation of multiplexers 324-327 is affected by the signal present on TE interconnect 344 and the state of the JTAG pass-through control bit in a TDR 332. More specifically, when a signal on TE interconnect 344 corresponds with the functional mode of operation (e.g., the signal is not asserted) and the JTAG pass-through control bit is set or cleared, multiplexers 324-326 cause the dual-purpose interconnects 340-343, 350-353 to correspond with interconnects to a serial port (e.g., an I2C or SPI port) connected with CPU 314. More specifically, in the functional mode, multiplexer 324 passes signals from TDI, TMS, and TCK interconnects 340-342 to slave port 312, and multiplexer 325 passes signals from master port 310 to TDI-F (TDI forward), TMS-F (TMS forward), and TCK-F (TCK forward) interconnects 350, 351, 352. As mentioned previously, master port 310 may be a SPI port. In such an embodiment, in the functional mode, multiplexer 327 may pass a signal (e.g., corresponding to a SPI MISO (master input/slave output) signal) from the master port 310 to TDO-R interconnect 353. Similarly, when slave port 312 is a SPI port, multiplexer 326 may pass a signal (e.g., corresponding to a SPI MISO signal) from slave port 312 to TDO interconnect 343.

Conversely, in the JTAG test mode (e.g., when a signal is asserted on TE interconnect 344), multiplexers 324-326 cause the dual-purpose interconnects 340-343, 350-352 to correspond with JTAG interconnects. More specifically, multiplexer 324 passes signals from the TDI interconnect 340 to the TAP controller 320, which shifts the signals into either IR 330 or a TDR 332 (depending on the state of the TAP controller 320), and also passes signals from the TMS and TCK interconnects 341, 342 to tap controller 320. In addition, multiplexer 325 passes signals from TDI, TMS, and TCK interconnects 340-342 to TDI-F, TMS-F, and TCK-F interconnects 350-352. When the JTAG pass-through control bit is reset/cleared and the TE-F signal is asserted (i.e., the IC is in a JTAG pass-through mode), a signal present on the TDO-R interconnect 353 is passed through, via multiplexer 327 to multiplexer 326, and multiplexer 326 passes the signal from multiplexer 327 to TDO interconnect 343. Otherwise, the IC is not in a JTAG pass-through mode (e.g., the JTAG pass-through control bit is set), multiplexer 326 passes data from one of the TDRs 332 to TDO interconnect 343. In JTAG pass-through mode, signals being transferred between the TDI/TMS/TCK interfaces 340-342 and the TDI-F/TMS-F/TCK-F interfaces 350-352 are unclocked. Similarly, signals being transferred between the TDO-R interface 353 and the TDO interface 343 also are unclocked.

The TE signal may be passed to downstream devices (e.g., downstream ICs) via AND logic 360 and a TE-F (test enable forward) interconnect 354, in an embodiment. More particularly, AND logic 360 receives both the signal present on the TE interconnect 344 and a TE pass-through enable signal. The TE pass-through enable signal, which may be generated based on the state of the TE signal and the JTAG pass-through control bit in a TDR 332, indicates whether or not the IC is allowing or blocking the TE signal from being passed through to a downstream device. When a signal is asserted on the TE interconnect 344 and the TE pass-through enable signal is asserted (e.g., the designated bit in the TDR 332 is reset/cleared and the IC is in JTAG pass-through mode), AND logic 360 asserts a TE-F signal on the TE-F interconnect 354. The TE-F interconnect 354 may, in turn, be coupled with a TE interconnect of a downstream IC (not illustrated).

Similar to the TE-F interconnect 354, and as will be described in more detail in conjunction with FIG. 4, the TDI-F, TMS-F, and TCK-F interconnects 350-352 may be coupled to corresponding TDI, TMS, and TCK interconnects of a downstream IC. In addition, the TDO-R interconnect 353 may be coupled to a corresponding TDO interconnect of the downstream IC. As discussed above, the operation of TDO multiplexer 327 is controlled by the state of a TE-F signal. Accordingly, operation of TDO multiplexer 327 is affected by the state of the JTAG pass-through control bit and the corresponding TE pass-through enable signal, in an embodiment. When the TE-F signal is asserted, TDO multiplexer 327 passes a signal present on the TDO-R interconnect 353 through to TDO multiplexer 326 (which, in turn, may pass the signal through to the TDO-interconnect 343).

According to an embodiment, test circuit 300 also includes circuitry that supports coordinated reset of the IC and any downstream ICs. The description below assumes that the system supports an active-low reset, although those of skill in the art would understand that the system alternatively may support an active-high reset. According to an embodiment, the reset circuit is configured so that, when a signal is asserted on the TE interconnect 344, reset is controlled by an external reset signal (e.g., a reset signal presented on RESETB interconnect 364 from external test equipment or an upstream IC), and other system resets (e.g., power on reset or resets from CPU 314) are irrelevant.

In an embodiment, the reset circuit includes AND logic 359, OR logic 361, and AND logic 362. AND logic 359, OR logic 361, and AND logic 362 receive various signals relating to reset conditions. The signals input to AND logic 359 may include, for example, a POR_B (power on reset, asserted low) signal, a reset signal (asserted low) from CPU 314. When both of the signals input to AND logic 359 are high, the output of AND logic 359 is high, and when either of the signals are low, the output of AND logic 359 is low. The POR_B signal may be low during power up of the device and high otherwise, and the CPU reset signal may be low when the CPU 314 attempts to reset a downstream IC. The signals input to OR logic 361 include the output signal from AND logic 359 and a TE signal (e.g., from the TE interconnect 344). When either of the signals input to OR logic 361 are high, the output of OR logic 361 is high, and when all of the signals are low, the output of OR logic 361 is low. The TE signal is low in the functional mode, and therefore resets in the functional mode are governed by the POR_B and CPU reset signals, in addition to the external reset signal presented on RESETB interconnect 364. Conversely, the TE signal is high in the JTAG test mode, and therefore the output of OR logic 361 always is high when the IC is in the JTAG test mode. In other words, when the TE signal is high, only an external reset 364 can assert INT_RESETB and RESETB_F.

The output from OR logic 361 is provided to AND logic 362, which also receives a signal from external reset interconnect 364. When the signal from OR logic 361 is low, or the signal from external reset interconnect 364 is low, AND logic 362 asserts an internal reset (INT_RESETB) and a signal on RESETB-F (reset forward) interconnect 366. Alternatively, when both the signals from OR logic 361 and the signal from external reset interconnect 364 are high, AND logic 362 does not assert a signal on RESETB-F interconnect 366. As the above description indicates, in the JTAG test mode (i.e., when the output from OR logic 361 is high), the signal state on the RESETB-F interconnect 366 is governed by the signal on the external reset interconnect 364. The RESETB-F interconnect 366 may be coupled to a corresponding reset interconnect of a downstream IC. Accordingly, reset signals may be provided by the IC to the downstream IC.

When the IC is in a functional mode, the system clock (CLK) may be provided by an on-chip oscillator (OSC) 370, an on-chip phase locked loop, an on-chip digital phase locked loop, other on-chip clock sources, or an external (off-chip) clock source, in various embodiments. Conversely, when the IC is in JTAG test mode, the system clock is provided by an external clock source (e.g., a clock generated by external test equipment) via EXTCLK (external clock) interconnect 374. According to an embodiment, the IC also includes multiplexer 328, which selectively supplies the system clock and passes a clock signal to a CLK-F (clock forward) interconnect 376 based on the signal asserted on the TE interconnect 344. When no signal is asserted on the TE interconnect 344 (e.g., the IC is in functional mode), multiplexer 328 uses the clock signal from OSC 370 (or another clock source) as the system clock, and passes that clock signal to the CLK-F interconnect 376. Conversely, when a signal is asserted on the TE interconnect 344 (e.g., the IC is in JTAG test mode), multiplexer 328 uses the clock signal provided on the EXTCLK interconnect 374 as the system clock, and passes that clock signal to the CLK-F interconnect 376. The CLK-F interconnect 376 may be coupled to a corresponding EXTCLK interconnect of a downstream IC. Accordingly, clock signals may be provided by the IC to the downstream IC.

As discussed above, multiple ICs may be coupled together in a manner that enables various signals associated with the functional and JTAG test modes to be passed between the multiple ICs. FIG. 4 illustrates a simplified block diagram of a multiple-IC system 400 (e.g., a system in package (SiP)) with integrated test circuitry, according to an example embodiment. More particularly, the multiple-IC system 400 is shown to include three ICs 402, 403, 404. Although system 400 is shown to include three ICs 402-404 and associated test circuits 412-414, embodiments may be implemented in systems that include only two ICs and test circuits, or systems that include more than three ICs and test circuits. In addition, although each of ICs 402-404 may have configurations such as that illustrated in conjunction with the IC of FIG. 3, ICs 402-404 are shown in a simplified format (e.g., the CPU, reset circuit, clock circuit, and various other circuitry of FIG. 3 are not illustrated in FIG. 4 for purposes of simplicity and clarity).

System 400 may communicate with external circuitry (e.g., other system circuitry or external test equipment) through dual-purpose pins 440, 441, 442, 443, and each of ICs 402-404 may interface with the dual-purpose pins 440-443 or with each other via corresponding interconnects. The pins 440-443 and interconnects are dual-purpose, as described previously, in that they may function as both JTAG pins/interconnects when the ICs 402-404 are in JTAG test mode, and alternatively as pins/interconnects that provide connectivity with the slave ports 412-414 of the ICs 402-404 when the ICs 402-404 are configured in a functional mode. In addition, system 400 includes a TE pin 444, which connects with a TE interconnect (not illustrated) on IC 402. A TE signal asserted on TE pin 444 may be passed by IC 402 to a TE interconnect (not illustrated) of downstream IC 403 using AND logic 460, and the TE signal also may be passed by IC 403 to a TE interconnect 445 of downstream IC 404 using AND logic 461, as previously described in conjunction with FIG. 3.

ICs 402-404 are connected in series (e.g., daisy chained together) so that each IC is either upstream or downstream from the other ICs. As used herein, the term "upstream IC," as it relates to the relationship between two ICs in a serial configuration, means the IC of the serial pair that is more closely coupled with the external pins (e.g., pins 440-443) than the other IC to which it is connected. Similarly, the term "downstream IC" means the IC of the serial pair that is not as closely coupled with the external JTAG pins than the other IC to which it is connected. Accordingly, in FIG. 4, IC 402 is upstream of ICs 403 and 404, IC 403 is downstream of IC 402 and upstream of IC 404, and IC 404 is downstream of ICs 402 and 403.

Each of ICs 402-404 includes a test circuit 405, 406, 407 and a slave port 412, 413, 414 (e.g., a SPI or I2C port). Each of ICs 402 and 403 also include a master port 415, 416 (e.g., a SPI or I2C port). Since IC 404 is the most downstream IC, IC 404 optionally may include a master port 417 (and multiplexers 429, 432), although they are not required. Although not shown for purposes of simplicity, each of ICs 402-404 also may include a CPU (or other circuitry) coupled between the master and slave ports 412-417, signal (I/O) interconnects that interface with the CPU (or other circuitry), one or more scan chains, one or more power interconnects, one or more ground interconnects, and so on.

When IC 402 is in the functional mode (e.g., a TE signal is not asserted), signals present on dual-purpose pins 440-442 are provided via dual-purpose interconnects (not illustrated) of IC 402 and multiplexer 424 to slave port 412, and those signals may be acted upon by the CPU (or other circuitry) of IC 402. In addition, the CPU (or other circuitry) of IC 402 may provide signals to multiplexer 425 and slave port 413 of downstream IC 403 via master port 415, multiplexer 427, and various interconnects between ICs 402, 403. Similarly, the CPU (or other circuitry) of IC 403 may provide signals to multiplexer 426 and slave port 414 of further downstream IC 404 via master port 416, multiplexer 428, and various interconnects between ICs 403, 404. Accordingly, the various ICs 402-404 of system 400 may operate in a master-slave configuration, where IC 402 may be the master of IC 403, and IC 403 may be the master of IC 404.

As with the IC of FIG. 3, the test circuits 405-407 are accessed through JTAG ports, each of which includes a plurality of JTAG interconnects, as previously described (e.g., TDI, TMS, TCK, and TDO interconnects). The JTAG interconnects of the most upstream IC (i.e., IC 402) are coupled with dual-purpose pins 440-443. More particularly, the dual-purpose pins 440-443 include a TDI pin 440; a TMS pin 441; a TCK pin 442; and a TDO pin 443, which may double as serial port pins when the ICs 402-404 are in functional mode, as described above. The dual-purpose pins 440-443 and corresponding interconnects also may include a TRST pin and interconnects (not illustrated).

Each test circuit 405-407 includes a plurality of shift registers, a TAP controller 420, 421, 422, a test subsystem (not shown), multiplexers 424, 425, 426, 427, 428, 429 (optional), 430, 431, 432 (optional), 433, 434, 435, and various other logic, as previously described in conjunction with FIG. 3. In addition, system 400 also may include a TE pin 444 connected with a TE interconnect (not illustrated) of IC 402, and each test circuit 405-407 may include circuitry that enables signals present on the TE pin to be passed to downstream ICs and to control the functionality of multiplexers 424-435. As described previously, when the TE signal is asserted on the TE pin and TAP controllers 420, 421 have not otherwise blocked propagation of the TE signal to downstream ICs, each of ICs 402-404 receives the TE signal.

When the TE signal is asserted (e.g., the ICs 402-404 are in JTAG test mode), multiplexers 424-426 pass input JTAG signals (i.e., TDI, TMS, TCK) present at their JTAG interfaces to TAP controllers 420-422 and their associated data and instruction registers, and multiplexers 427, 428 pass the input JTAG signals to the corresponding downstream ICs. For example, multiplexer 427 of IC 402 passes input JTAG signals (i.e., signals received via dual-purpose pins 440-442 and dual-purpose interconnects of IC 402) to IC 403, and multiplexer 428 of IC 403 passes input JTAG signals (i.e., signals received via dual-purpose interconnects of ICs 402, 403) to IC 404. Accordingly, in the JTAG test mode, each IC 402-404 receives the same JTAG signals.

A TAP controller 420-422 of only one IC 402-404 at a time produces signals to be output on the TDO pin 443, and the test circuits 405-407 are configured so that the signals present on the TDO pin 443 correspond to signals produced by a single TAP controller 420-422. In order to receive output signals (i.e., TDO signals) from a particular TAP controller 420-422, all upstream ICs are reset/cleared into JTAG pass-through mode. As discussed previously, to reset/clear an IC into JTAG pass-through mode, a signal is asserted on a TE interconnect of the IC, and a JTAG pass-through control bit in a TDR of an upstream IC is reset/cleared. In this configuration, the IC will pass signals received on its TDO-R interconnect (e.g., TDO-R interconnect 353, FIG. 3) to its TDO interconnect (e.g., TDO interconnect 343, FIG. 3), as previously explained. For example, in order to receive output signals from TAP controller 422 of IC 404, ICs 402, 403 are configured in JTAG pass-through mode. Accordingly, multiplexer 435 passes test output signals received from TAP controller 422 to the TDO interconnect (not illustrated) of IC 404, which signals are received at the TDO-R interconnect (not illustrated) and multiplexer 431 of IC 403. Multiplexers 431 and 434 of IC 403, in turn, pass the test output signals (from TAP controller 422) to the TDO interconnect (not illustrated) of IC 403, which signals are received at the TDO-R interconnect (not illustrated) and multiplexer 430 of IC 402. Multiplexers 430 and 433 of IC 402, in turn, pass the test output signals (from TAP controller 422) to the TDO interconnect (not illustrated) of IC 402, which is connected to TDO pin 443. Accordingly, when ICs 402, 403 are in JTAG pass-through mode, the test output signals from TAP controller 422 of IC 404 may be passed through ICs 402, 403 to the TDO pin 443 of system 400.

Similarly, in order to receive output signals from TAP controller 421 of IC 403, IC 402 is configured in JTAG pass-through mode. Accordingly, multiplexer 434 passes test output signals received from TAP controller 421 to the TDO interconnect (not illustrated) of IC 403, which signals are received at the TDO-R interconnect (not illustrated) and multiplexer 430 of IC 402. Multiplexers 430 and 433 of IC 402, in turn, pass the test output signals (from TAP controller 421) to the TDO interconnect (not illustrated) of IC 402, which is connected to TDO pin 443. Accordingly, when IC 402 is appropriately configured, the test output signals from TAP controller 421 of IC 403 may be passed through IC 402 to the TDO pin 443 of system 400.

As discussed previously, the instruction register (e.g., IR 330, FIG. 3) associated with a TAP controller holds a current instruction. The content of the IR and the states of various bits in the test data registers (e.g., TDRs 332, FIG. 3) affect how the TAP controller processes or transfers received signals. More specifically, each TAP controller 420-422 includes instruction decode logic (not illustrated) that decodes opcodes shifted into the TAP controller's IR according to a pre-defined mapping of opcodes to instructions. As the above discussion indicates, in JTAG pass-through mode, each IC 402-404 receives the same JTAG input signals (i.e., TDI, TMS, TCK). Accordingly, each IC 402-404 clocks in identical opcodes into its corresponding IR. In order to avoid a scenario in which multiple ICs are attempting to produce output test data on the TDO pin 443, each TAP controller in a system that includes multiple ICs and TAP controllers (e.g., system 400) is operated based on a different, pre-defined opcode-to-instruction mapping (e.g., a mapping hardcoded into each TAP) from the other TAP controllers, in an embodiment. More specifically, the decode logic of each TAP controller decodes a set of opcodes differently from the manner in which the other TAP controllers decode the same set of opcodes. In other words, whereas a first TAP controller may map an opcode to a first instruction that causes the first TAP controller to perform a first operation, a second TAP controller maps the same opcode to a second and different instruction that causes the second TAP controller to perform a second operation that is different from the first operation.

Figure 4:
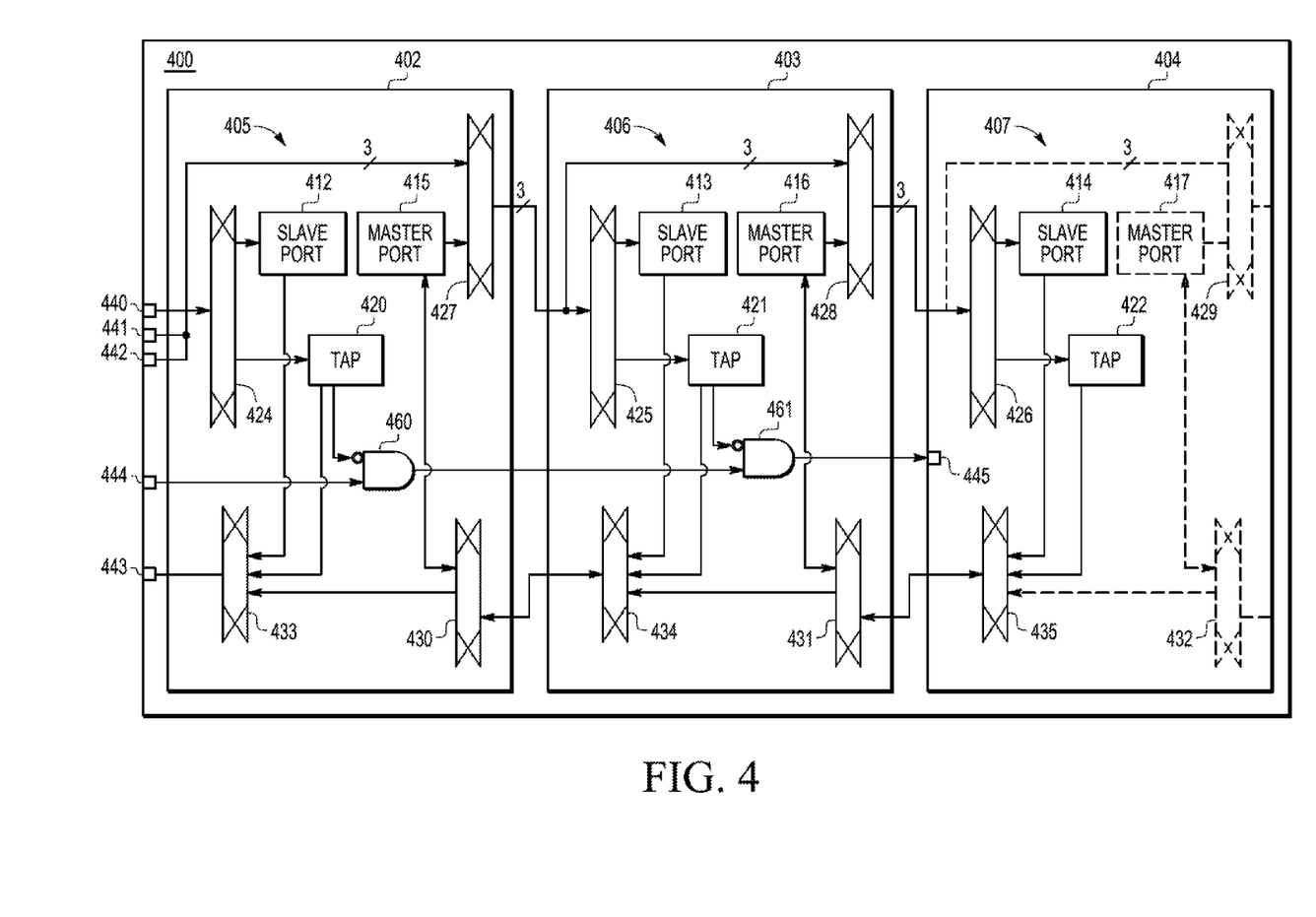
FIG. 4 illustrates a simplified block diagram of a multiple-IC system with integrated test circuitry, according to an example embodiment.

The system 400 of FIG. 4 will be used to further explain the implementation of different opcode-to-instruction mappings for each IC of a multiple-IC system. For ease of explanation, assume the system 400 of FIG. 4 includes only ICs 402, 403, where IC 402 is a master controller, and IC 403 is a slave controller. According to an embodiment, the TAP controller decode logic of IC 402 would operate based on a first, pre-defined opcode-to-instruction mapping, and the TAP controller decode logic of IC 403 would operate based on a second, pre-defined opcode-to-instruction mapping that is different from the first. In an embodiment, the opcode-to-instruction mappings are defined such that TAP controllers may concurrently execute different instructions. The opcode-to-instruction mappings are compatible, however, in that the TAP controller of only one IC at a time may execute an instruction that drives a signal onto the TDO interconnect 443. In an embodiment, the opcode-to-instruction mappings are such that each other TAP controller either executes a BYPASS instruction or some other instruction (i.e., a "non-BYPASS" instruction, which includes instructions other than the BYPASS instruction).

For example, in an embodiment, the opcode-to-instruction mappings may be pre-defined so that any given opcode only maps to a non-BYPASS instruction for only one IC of the system, and the same opcode maps to a BYPASS instruction for all other ICs of the system. Accordingly, master controller IC 402 operates based on a pre-defined mapping in which a first group of opcodes corresponds to non-BYPASS instructions, and a second, mutually-exclusive group of opcodes corresponds to BYPASS instructions. In addition, slave controller IC 403 operates based on a different, pre-defined mapping in which the same first group of opcodes corresponds to BYPASS instructions, and at least some of the same second group of opcodes may correspond to non-BYPASS instructions (although they do not have to correspond to non-BYPASS instructions, and they may correspond to BYPASS instructions, as well).

Table 1, below, is an example of JTAG instruction sets for a system that includes three ICs and corresponding TAP controllers (e.g., TAPs 420-422, FIG. 4). Although specific mappings of opcodes-to-instructions are listed in Table 1, it is to be understood that instruction sets that are different from the instruction sets of Table 1 may be defined, and/or the various instructions may be mapped to different opcodes.

TABLE 1

Example JTAG Instruction Sets

| Opcode | TAP Controller 1 (e.g., TAP 420) | TAP Controller 2 (e.g., TAP 421) | TAP Controller 3 (e.g., TAP 422) |
|---|---|---|---|
| all ones | BYPASS | BYPASS | BYPASS |
| 1 | SAMPLE/PRE-LOAD | BYPASS | BYPASS |
| 2 | BYPASS | SAMPLE/PRE-LOAD | BYPASS |
| 3 | BYPASS | BYPASS | SAMPLE/PRE-LOAD |
| 4 | EXTEST | BYPASS | BYPASS |
| 5 | BYPASS | EXTEST | BYPASS |
| 6 | BYPASS | BYPASS | EXTEST |
| 7 | INTEST | BYPASS | BYPASS |
| 8 | BYPASS | INTEST | BYPASS |
| 9 | BYPASS | BYPASS | INTEST |
| 10 | CLAMP | BYPASS | BYPASS |
| 11 | BYPASS | CLAMP | BYPASS |
| 12 | BYPASS | BYPASS | CLAMP |
| 13 | IDCODE | BYPASS | BYPASS |
| 14 | BYPASS | IDCODE | BYPASS |
| 15 | BYPASS | BYPASS | IDCODE |
| 16 | SELECT TDR1 | BYPASS | BYPASS |
| 17 | BYPASS | SELECT TDR1 | BYPASS |
| 18 | BYPASS | BYPASS | SELECT TDR1 |
| 19 | SELECT TDR2 | BYPASS | BYPASS |
| 20 | BYPASS | SELECT TDR2 | BYPASS |
| 21 | BYPASS | BYPASS | SELECT TDR2 |

As Table 1 indicates, in an embodiment, opcodes that map to non-BYPASS instructions for one controller map to BYPASS instructions for the other controllers. For example, where opcodes 1, 4, 7, 10, 13, 16, and 19 map to non-BYPASS instructions for controller 1, these opcodes map to a BYPASS instruction for controllers 2 and 3. Similarly, where opcodes 2, 5, 8, 11, 14, 17, and 20 map to non-BYPASS instructions for controller 2, these opcodes map to a BYPASS instruction for controllers 1 and 3, and so on. Accordingly, even though the same opcode simultaneously may be clocked into each controller (e.g., all ICs 402-404), only one IC (e.g., the IC whose test data output is desired on the TDO pin 443) may map the opcode to a non-BYPASS instruction. For example, referring to Table 1, after opcode 13 has been clocked into controllers 1-3, execution by controller 1 of the instruction to which opcode 13 maps (i.e., the IDCODE instruction) will cause controller 1 to send out the TAP identifier from the IDCODE register on the TDO interconnect 443. However, execution by controllers 2 and 3 of the instruction to which opcode 13 maps (i.e., the BYPASS instruction) will cause controllers 2 and 3 to enter or remain in BYPASS, in which the controllers 2 and 3 do not send out data on the TDO interconnect 443. As Table 1 and the above discussion also indicate, different opcodes cause different controllers to execute the same instruction. For example, opcodes 1, 2, and 3 (i.e., "different opcodes") cause controllers 1, 2, and 3 (i.e., "different controllers") to execute a SAMPLE/PRELOAD instruction (i.e., "the same instruction"). Recall that a TDR control bit (along with the TE signal) determines whether the most upstream IC drives the external TDO pin (e.g., TDO pin 443, FIG. 4) or a downstream IC drives the external TDO pin. In other words, the TAP controller opcodes (e.g., the opcodes of Table 1, above) that are present in the ICs (e.g., ICs 402, 403, 404, FIG. 4) do not determine which IC drives the external TDO pin.

According to an embodiment, the BYPASS instruction, when executed, selects the TDI-to-TDO bypass register (e.g., one of TDRs 332, FIG. 3), which places or maintains an IC in the TDI-to-TDO bypass mode. The SAMPLE instruction, when executed, selects the boundary scan register (e.g., one of TDRs 332, FIG. 3) so that interconnect values can be read into the boundary scan register, and the PRELOAD instruction, when executed, loads interconnect output values before EXTEST. In the embodiment depicted in conjunction with Table 1, the SAMPLE and PRELOAD instructions are combined (i.e., as a SAMPLE/PRELOAD instruction). The EXTEST instruction, when executed, may be used for external testing, such as using interconnects to probe board-level behaviors. An EXTEST instruction alternatively may operate on a core (e.g., writing data to the core). The INTEST instruction, when executed, may be used for internal testing, such as using interconnects to probe on-chip behaviors. An INTEST instruction alternatively may operate on a core (e.g., reading data from the core). The CLAMP instruction, when executed, drives the output interconnects using preloaded values. The IDCODE instruction, when executed, selects the IDCODE register (e.g., one of TDRs 332, FIG. 3) so that the TAP identifier can be read out from the IDCODE register. The SELECT TDR (test data register) instructions, when executed, result in the selection of a design specific test data register (e.g., one of TDRs 332, FIG. 3) into which a value substantively may be clocked in or out. The TDRs may be used for a variety of purposes, such as providing access to design-specific test support features (e.g., self-tests, scan paths, and so on).

Besides the instructions listed in Table 1, other instructions also or alternatively may be defined, including for example: HIGHZ (deactivates outputs of all interconnects); RUNBIST (places the IC in a self-test mode); SCAN_N (configures a scan path select register affecting the signals to which other boundary scan operations apply); USERCODE (returns a user-defined code); other SELECT_TDR instructions (e.g., to select additional TDRs); and other manufacturer or user defined instructions.

Figure 5:
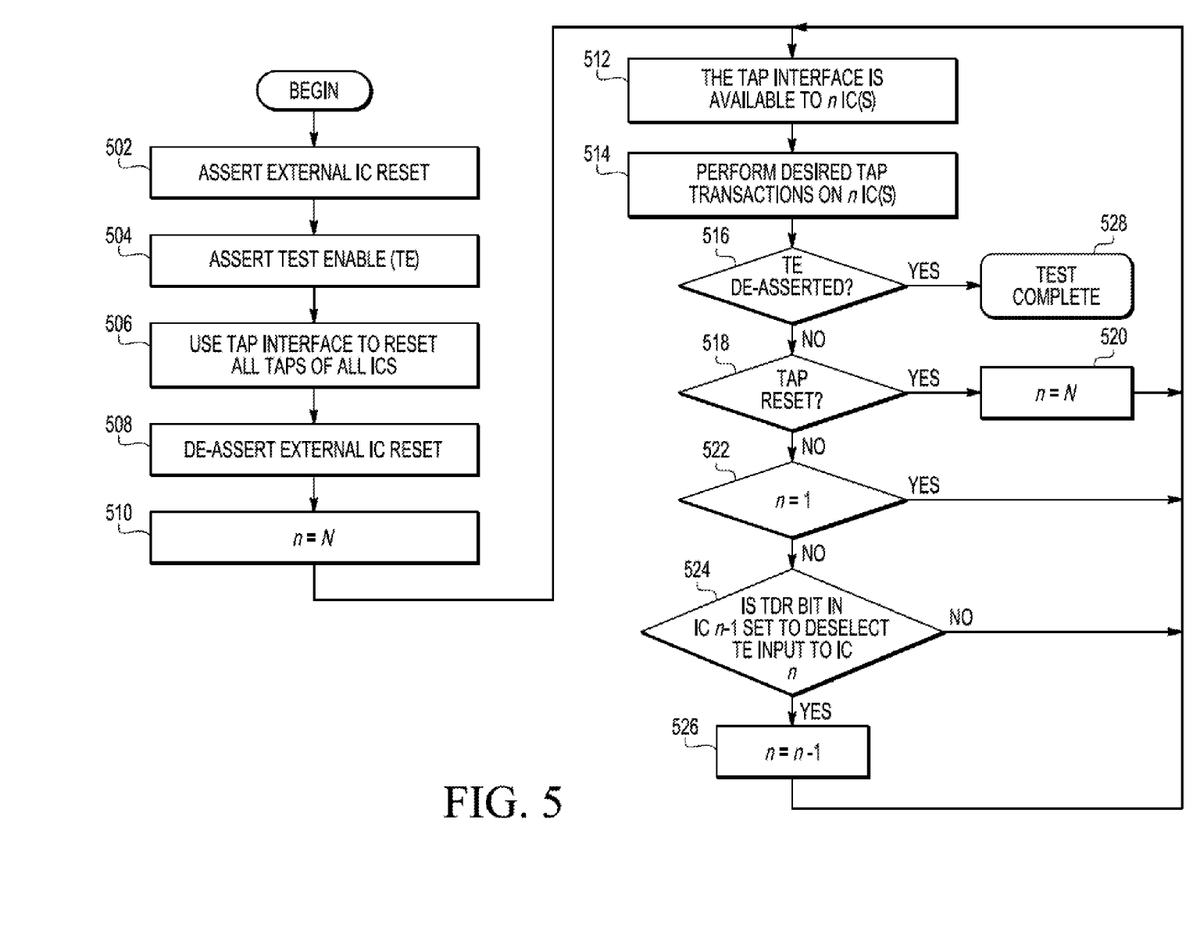
FIG. 5 illustrates a flowchart of a method for testing a multiple-IC system, according to an example embodiment.

FIG. 5 illustrates a flowchart of a method for testing a multiple-IC system (e.g., system 400, FIG. 4), according to an example embodiment. The method may be used to test a multiple-IC system having any number of ICs interconnected in a series as described above. To facilitate the discussion of the method, various elements of FIG. 4 may be referred to. However, it is to be understood that the method may be used in a system that includes fewer or more than three ICs. In the interest of generalizing the flowchart of FIG. 5 to apply to systems having an arbitrary number of ICs, a fixed value N is used in the flowchart to indicate a number of ICs in a series, and a parameter n is used to indicate a particular IC in the series to which various steps apply. It is to be understood that in a system in which the number of ICs is known, steps associated with setting and updating the parameter n may be excluded from the method, and instead the flowchart may be modified to flow in a more linear manner. These and other modifications to the sequence of steps illustrated in FIG. 5 are intended to be included within the scope of the inventive subject matter.

The method may begin by resetting the TAP controllers (e.g., TAP controllers 420-422, FIG. 4) of all of the ICs in the series. When the TAP includes a TRST pin and corresponding interconnects, the TAP controllers may be asynchronously reset to a reset state (e.g., the Test-Logic-Reset controller state defined in IEEE Standard 1149.1) when a logic 0 is applied to the TRST pin. Otherwise, when reset is not performed using a signal on a TRST pin, the reset process essentially includes clocking each TAP controller a number of times to ensure that each TAP controller, which may be in an arbitrary state at this point, is transitioned to the reset state. In such an embodiment, reset may include blocks 502-508, described below. More particularly, the reset process may begin, for example, by asserting an external IC reset signal that is provided to at least the most upstream IC in the series (e.g., IC 402, FIG. 4), in block 502. For example, this may include external test equipment providing a signal to a reset interconnect (e.g., RESETB interconnect 364, FIG. 3) of the most upstream IC in the series.

In block 504, which is performed whether or not a TRST pin is available and used to perform reset, the test enable (TE) signal is asserted. According to an embodiment, this may include the external test equipment asserting a signal that is provided to an external TE pin (e.g., TE pin 444, FIG. 4) that is coupled with the TE interconnect of the most upstream IC (e.g., IC 402, FIG. 4) in the series (i.e., a TE signal). As described previously, the reset circuit of an IC is configured so that, when a signal is asserted on a TE interconnect (e.g., TE interconnect 344, FIG. 3), reset is controlled by the external reset signal (e.g., the reset signal on RESETB interconnect 364, FIG. 3). Accordingly, when both the TE signal and an external reset signal are in the correct states, the IC's reset circuitry (e.g., OR logic 361 and AND logic 362, FIG. 3) produces an internal reset (INT_RESETB) signal, and also conveys the reset signal to the RESETB interconnect of the next downstream IC (e.g., via RESETB-F interconnect 366 and an inter-IC conductor between the RESETB-F interconnect 366 and a RESETB interconnect 364 of the next downstream IC). In addition, as described previously, assertion of the TE signal configures the dual-purpose interconnects of any IC receiving the TE signal as JTAG interconnects (e.g., via multiplexers 324-326, FIG. 3). Accordingly, when the TE signal is asserted for an IC, communications with the IC's TAP controller (e.g., TAP controller 320, FIG. 3) and registers (e.g., IR 330 and TDRs 332, FIG. 3) is possible via the JTAG interconnects. Assertion of the TE signal and the state of the JTAG pass-through control bit (e.g., a bit in TDRs 332, FIG. 3) in an IC also provides for transfer of signals present on various input JTAG interconnects (e.g., TDI interconnect 340, TMS interconnect 341, TCK interconnect 342, and TDO-R 353, FIG. 3) to corresponding output JTAG interconnects (e.g., TDI-F interconnect 350, TMS-F interconnect 351, TCK-F interconnect 352, and TDO 343, FIG. 3).

Initially, the most upstream IC (e.g., IC 402, FIG. 4) may not be configured to convey the TE signal to the next downstream IC (e.g., IC 403, FIG. 4). As discussed previously, each upstream IC (e.g., ICs 402, 403, FIG. 4) may include circuitry (e.g., AND logic 360, 460, 461, FIGS. 3, 4) that enables the TE signal to be blocked or conveyed to a downstream IC. In order to convey the TE signal to a downstream IC, the upstream IC may assert a TE pass-through enable signal, as discussed previously. The TE pass-through enable signal may be generated based on the state of a designated bit in a TDR (e.g., one of TDRs 332, FIG. 3), and therefore to assert the TE pass-through signal and to convey the TE signal to a downstream IC, an appropriate value should be clocked into the designated bit of the upstream IC (e.g., a designated bit of one of TDRs 332, FIG. 3).

In order to reset the TAP controllers of each IC and to convey the TE signal to each downstream IC, appropriate signals are provided (e.g., by external test equipment) to the external TAP interface, in block 506. In other words, the TAP interface is used to reset the TAP controllers of all ICs in the series. According to an embodiment, this may include clocking the TMS pin (e.g., pin 441, FIG. 4) a number of times to cause the TAP controllers of all of the ICs to enter the reset state (e.g., the Test-Logic-Reset controller state defined in IEEE Standard 1149.1), and to reset values into the appropriate TDR bit of the upstream ICs to cause the ICs to convey the asserted TE signal to the downstream ICs. This process proceeds sequentially starting at the most upstream IC (e.g., IC 402, FIG. 4). In other words, the TAP controller (e.g., TAP controller 420, FIG. 4) of the most upstream IC is clocked to set the TAP controller in the reset state, and to reset a TDR bit to a state in which the TE pass-through enable signal is asserted. At this point, the TE signal is provided to the next downstream IC (e.g., IC 403, FIG. 4), the TAP controller (e.g., TAP controller 421, FIG. 4) of that IC may be reset, and the TE pass-through enable signal may be reset in that IC to convey the TE signal to the next downstream IC (e.g., IC 404, FIG. 4). This process is repeated until the TAP controllers of all ICs in the series have been reset.

Once TAP controller reset has been completed, in block 506, the external IC reset is de-asserted, in block 508. At this point, all of the upstream ICs (e.g., ICs 402, 403, FIG. 4) are in a configuration to provide the test enable signal to the next downstream device (e.g., via TE-F interconnect 354, FIG. 3, which is connected to the TE interconnect 344 of the next downstream device). All ICs in the series have been reset and are receiving the asserted TE signal, and thus all ICs in the series are in the test mode of operation and their dual-purpose interconnects provide for communication with their respective TAP controllers. Blocks 510-526, which will be described next, depict an embodiment of a method for selecting a particular IC to provide output test data (e.g., on TDO pin 443, FIG. 4), and for performing a JTAG test on the system.

In block 510, a parameter n is initialized to a value of N, which equals the number of ICs in the series. As discussed above, the values N and n are used to generalize the flowchart of FIG. 5 to be applicable to systems with any number of ICs, and in actuality the values N and n may not be used in implementing the method in an actual system. Regardless, the values N and n are used to facilitate generality and explanation of embodiments of the method. As will be clarified below, the current value of the parameter n corresponds to the lowest downstream device that is still in the test mode (i.e., that is receiving an asserted test enable signal on its TE interconnect).

After reset, the TAP interface is available to n ICs in the series, as indicated by block 512. Because the value of n equals N during the first iteration of the loop that includes block 512, the TAP interface is available to all of the ICs in the series (e.g., to ICs 401-403, FIG. 4).

In block 514, desired TAP transactions are performed on the n ICs of the series. During the first iteration of the loop that includes block 514, desired TAP transactions are performed on all of the ICs of the series. Essentially, each tap transaction includes clocking an instruction opcode (e.g., an opcode listed in Table 1, above) into the instruction registers (e.g., IR 330, FIG. 3) associated with each TAP controller and, in some cases (e.g., when the opcode corresponds to a SELECT_TDR instruction), clocking data into a TDR (e.g., one of TDRs 332, FIG. 3). As discussed in detail previously, each TAP controller may be governed by a different opcode-to-instruction mapping, in which a particular opcode maps to a non-BYPASS instruction for only one of the ICs, and the same opcode maps to a BYPASS instructions for all other ICs. Accordingly, at any given time, only one IC is driving the external TDO interconnect, and the other ICs are blocked and cannot drive the external TDO interconnect.

In block 516, which may be performed earlier or later in the method, a determination may be made whether the TE signal (e.g., provided at TE pin 444, FIG. 4) has been de-asserted. If so, then the JTAG test has been completed (or terminated), and in block 528, the dual-purpose interconnects are again available to be used in conjunction with a serial port (e.g., an I2C port or a SPI port) or any other interface, if desired.

According to an embodiment, while the JTAG testing continues (e.g., the TE signal remains asserted for all ICs), the ICs of the series may be taken out of the JTAG test mode sequentially, if desired, starting with the most downstream IC (e.g., IC 404, FIG. 4), and working upward. Essentially, taking a downstream IC out of the JTAG test mode may be accomplished by discontinuing provision of the TE signal to that IC. Blocks 518-526 correspond to an embodiment in which ICs may be taken out of JTAG test mode in this manner, or in the case of blocks 518 and 520, the TAP controllers may be reset to make the JTAG interface again available to all TAP controllers if one or more downstream ICs have been taken out of JTAG test mode.

Referring again to block 516, if the TE signal has not been de-asserted, a further determination may be made whether a TAP reset has occurred, in block 518, which may be performed earlier or later in the method, in other embodiments. A TAP reset may be implemented by the external test equipment, for example, by clocking the signal on the TMS pin (e.g., TMS pin 441, FIG. 4) low a number of times (e.g., up to 5×N times), thus transitioning each TAP controller back into the reset state (e.g., the Test-Logic-Reset controller state defined in IEEE Standard 1149.1). When a TAP reset has occurred, then the parameter n is reset to the number of ICs in the series, N, and the method iterates as shown. In an alternate embodiment in which a TRST pin is provided, the TAP controllers may be asynchronously reset to the reset state when a logic 0 is applied to the TRST pin. Either way, once a TAP reset has occurred, the TAP interface is available to all of the ICs in block 512, and the method iterates as shown.

When a TAP reset has not occurred, a determination may be made, in block 522, whether the most upstream IC in the series (e.g., IC 402, FIG. 4) is the only IC that is still in the JTAG test mode (i.e., when n=1). If so, the method iterates as shown. If not, then a possibility exists for an upstream IC to discontinue conveying the TE signal to the next downstream IC in the series, thus effectively transitioning the downstream IC out of the JTAG test mode (i.e., making the JTAG interface unavailable to the downstream IC). In an embodiment, and as discussed previously, an upstream IC internally may produce a TE pass-through enable signal, which may be generated based on the stated of a designated bit in a TDR (e.g., one of TDRs 332, FIG. 3). When the TE pass-through enable signal is asserted, an asserted TE signal is provided to the TE interconnect of the next downstream IC (e.g., via TE-F interconnect 354, FIG. 3). Conversely, when the TE pass-through enable signal is de-asserted, the TE signal is not provided to the TE interconnect of the next downstream IC, and the next downstream IC is no longer in the JTAG test mode.

In block 524, a determination may be made whether the TE pass-through enable signal in IC n−1 (i.e., the second most downstream IC that is still in JTAG test mode) has been de-asserted. For example, during a first iteration of block 524 when n=N, a determination may be made whether the TE pass-through enable signal in IC n−1 (e.g., IC 403, FIG. 4) has been de-asserted. In a specific embodiment, this determination includes determining whether a TDR bit associated with the TE pass-through signal in IC n−1 (e.g., IC 403, FIG. 4) has been set to de-select the TE input into IC n (e.g., IC 404, which would be the most downstream IC that is still in JTAG test mode). If so, then the most downstream IC (e.g., IC 404, FIG. 4) no longer is in JTAG test mode, and the parameter n is decremented by 1, in block 526, indicating that the TAP interface is no longer available to that IC. The method may then iterate as shown, where the TAP interface now is available to one fewer IC in the series (e.g., to ICs 402 and 403, only). The method continues to iterate until the TE signal is de-asserted (e.g., as determined in block 516, discussed above), or some other event occurs to terminate the JTAG test.

Thus, various embodiments of integrated circuit testing methods and apparatus have been described above. An embodiment includes an IC having an input interconnect configured to receive an input signal, a test enable interconnect configured to receive a test enable signal, and a controller for performing testing of the IC based on values that correspond to the input signal. The IC also includes an input port and a multiplexer coupled to the input interconnect, the controller, and the input port. The multiplexer is controllable to pass the input signal to the input port in response to non-assertion of the test enable signal, and to pass the input signal to the controller in response to assertion of the test enable signal.

Another embodiment includes a multiple IC system that includes a plurality of external pins, a first IC, and a second IC. The first IC has a first TAP controller, a first instruction register, at least one first TDR, a plurality of first interconnects coupled with the plurality of external pins, and a plurality of second interconnects. The second IC has a second TAP controller, a second instruction register, at least one second TDR, and a plurality of third interconnects coupled with the plurality of second interconnects. The first TAP controller is configured to map an opcode, when clocked into the first instruction register, to a first instruction, and the second TAP controller is configured to map the opcode, when clocked into the second instruction register, to a second instruction that is different from the first instruction.

Another embodiment includes a method for testing a multiple IC system that includes at least a first IC with a first test controller and a second IC with a second test controller. The method includes configuring the first test controller and the second test controller in a test mode, clocking an opcode into a first instruction register associated with the first test controller and into a second instruction register associated with the second test controller. The method further includes the first test controller executing a first instruction based on the opcode, and the second test controller executing a second instruction based on the opcode, where the second instruction is different from the first instruction.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An integrated circuit comprising:
a first input interconnect configured to receive an input signal;
a first test enable interconnect configured to receive a test enable signal;
a controller for performing testing of the integrated circuit based on values that correspond to the input signal;
an input port;
a first multiplexer coupled to the first input interconnect, the controller, and the input port, and controllable to pass the input signal to the input port in response to non-assertion of the test enable signal, and to pass the input signal to the controller in response to assertion of the test enable signal;
a first test data out interconnect configured to produce test output data;
a second test data out interconnect configured to receive remotely-produced test output data;
a register configured to store an indication that the integrated circuit is or is not in a boundary scan pass-through mode;
a second multiplexer coupled to the first test data out interconnect, and controllable to pass first test output data produced by the integrated circuit to the first test data out interconnect to be produced as the test output data when the integrated circuit is not in the boundary scan pass-through mode; and
a third multiplexer coupled to the second test data out interconnect and to the second multiplexer, and controllable to pass the remotely-produced test output data to the second multiplexer to be produced as the test output data on the first test data out interconnect when the integrated circuit is in the boundary scan pass-through mode.

2. The integrated circuit of claim 1, wherein:
the input port is selected from a group consisting of an inter-integrated circuit (I2C) port and a serial peripheral interface (SPI) port.

3. The integrated circuit of claim 1, further comprising:
a first output interconnect configured to produce an output signal; and
a fourth multiplexer coupled to the first output interconnect and to the first input interconnect, and controllable in response to assertion of the test enable signal to pass the input signal to the first output interconnect to be produced as the output signal.

4. The integrated circuit of claim 3, further comprising:
an output port coupled to the fourth multiplexer and configured to produce output port signals, wherein the fourth multiplexer is controllable in response to non-assertion of the test enable signal to pass the output port signals to the first output interconnect to be produced as the output signal.

5. The integrated circuit of claim 4, wherein the output port is selected from a group consisting of an inter-integrated circuit (I2C) port, a serial peripheral interface (SPI) port, and a dual-mode I2C/SPI port.

6. The integrated circuit of claim 1, further comprising:
a second test enable interconnect configured to produce the test enable signal as an output signal.

7. The integrated circuit of claim 1, further comprising:
a reset interconnect configured to receive an external reset signal; and
a reset circuit coupled to the reset interconnect, and configured to produce an output reset signal corresponding to the external reset signal in response to assertion of the test enable signal.

8. The integrated circuit of claim 1, further comprising:
an external clock interconnect configured to receive an external clock signal; and
a clock circuit coupled to the external clock interconnect, and configured to produce an output clock signal corresponding to the external clock signal in response to assertion of the test enable signal.

9. A method of operating an integrated circuit comprising:
receiving, by, a first input interconnect, an input signal;
receiving, by a first test enable interconnect, a test enable signal;
performing, by a controller, testing of the integrated circuit based on values that correspond to the input signal;
passing, by a first multiplexer, the input signal to an input port in response to non-assertion of the test enable signal, and to passing the input signal to the controller in response to assertion of the test enable signal;
producing, by a first test data out interconnect, test output data;
receiving, by a second test data out interconnect, remotely-produced test output data;
setting, in a register, an indication of whether the integrated circuit is or is not in a boundary scan pass-through mode;

passing, by a second multiplexer, first test output data produced by the integrated circuit to the first test data out interconnect to be produced as the test output data when the integrated circuit is not in the boundary scan pass-through mode; and passing, by a third multiplexer, the remotely-produced test output data to the second multiplexer to be produced as the test output data on the first test data out interconnect when the integrated circuit is in the boundary scan pass-through mode.

10. The method of claim 9, further comprising:

producing, by a first output interconnect, an output signal; and passing, by a fourth multiplexer, the input signal to the first output interconnect in response to assertion of the test enable signal to be produced as the output signal.

11. The method of claim 10, further comprising:

producing output port signals by an output port, wherein the fourth multiplexer is controllable in response to non-assertion of the test enable signal to pass the output port signals to the first output interconnect to be produced as the output signal.

12. The method of claim 9, further comprising:

producing, by a second test enable interconnect, the test enable signal as an output signal.

13. The method of claim 9, further comprising:

receiving, by a reset interconnect, an external reset signal; and producing, by a reset circuit, an output reset signal corresponding to the external reset signal in response to assertion of the test enable signal.

14. The method of claim 9, further comprising:

receiving, by an external clock interconnect, an external clock signal; and producing, by a clock circuit, an output clock signal corresponding to the external clock signal in response to assertion of the test enable signal.

* * * * *